United States Patent
Imanaka et al.

(10) Patent No.: US 6,580,770 B2
(45) Date of Patent: Jun. 17, 2003

(54) INFORMATION REGENERATING APPARATUS AND INFORMATION REGENERATING METHOD

(75) Inventors: Yoshifumi Imanaka, Tokyo (JP); Hisao Katoh, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 254 days.

(21) Appl. No.: 09/757,466

(22) Filed: Jan. 11, 2001

(65) Prior Publication Data

US 2002/0027963 A1 Mar. 7, 2002

(30) Foreign Application Priority Data

Jun. 12, 2000 (JP) ........................................ 2000-175927

(51) Int. Cl.$^7$ ............................ H04L 27/06; H04L 7/00; H04L 27/14; H04L 27/16; H03D 1/00
(52) U.S. Cl. .................. 375/341; 375/355; 375/326
(58) Field of Search ................................ 375/341, 326, 375/355; 331/11, 14

(56) References Cited

U.S. PATENT DOCUMENTS

| | | | | |
|---|---|---|---|---|
| 5,748,045 A | * | 5/1998 | Tateishi | 331/17 |
| 5,841,323 A | * | 11/1998 | Fujimoto | 331/11 |
| 6,009,067 A | * | 12/1999 | Hayashi | 369/124 |
| 6,079,045 A | * | 6/2000 | Van Den Enden | 714/780 |
| 6,104,682 A | * | 8/2000 | Konishi | 369/44.34 |
| 6,324,225 B1 | * | 11/2001 | Brianti et al. | 375/341 |
| 6,374,035 B1 | * | 4/2002 | Yamashita | 386/93 |

\* cited by examiner

Primary Examiner—Mohammad H. Ghayour
Assistant Examiner—Tony Al-Beshrawi
(74) Attorney, Agent, or Firm—Burns, Doane, Swecker & Mathis, LLP

(57) ABSTRACT

Input data is converted into digital data in a A/D converter in synchronization with a regenerated clock, a zero-cross detecting signal of the digital data is detected in a zero-cross detector, a phase shift quantity is detected in a phase detector according to two pieces of digital data obtained before and after the detection of the zero-cross detecting signal, an average of phase shift quantities is calculated as target oscillation frequency data in a frequency calculating unit, the target oscillation frequency data is converted into analog data in a D/A converting unit, and the regenerated clock is generated in a voltage control oscillator according to the analog data and is provided for the A/D converter. Thereafter, the digital data is decoded to regenerated data in a Viterbi decoder in synchronization with the regenerated clock. Accordingly, because the constituent elements between the A/D converter and the D/A converter can be made of digital circuits, the information regenerating apparatus does not receive an adverse influence in which characteristics of analog circuits lack uniformity, and the information regenerating apparatus, which is operated at a uniform characteristic and has a high performance, can be obtained.

4 Claims, 6 Drawing Sheets

US 6,580,770 B2

INFORMATION REGENERATING APPARATUS AND INFORMATION REGENERATING METHOD

BACKGROUND OF THE INVENTION

1. Field of the Invention

The present invention relates to an information regenerating apparatus and an information regenerating method in which a regenerated clock is produced from input data, for example, read out from an optical disk such as digital video disk (DVD) to regenerate input data in synchronization with the regenerated clock.

2. Description of Related Art

FIG. 11 is a constitutional diagram showing a conventional information regenerating apparatus. In FIG. 11, 1 indicates an auto-gain controller (AGC) for adjusting an amplitude of input data (RF) read out from an optical disk. 2 indicates a waveform equalizer (EQ) for reshaping a waveform of the input data. The waveform equalizer 2 is composed of a filter for heightening a gain of an attenuated high-frequency signal component of the input data and a low pass filter for removing an unnecessary high-frequency noise of the input data. 3 indicates a slicer for expressing the input data in binary data to produce regenerated data (DATA). The slicer 3 has a comparator for determining the regenerated data to binary data of "0" and "1" according to a comparison between the input data and a reference electric potential.

4 indicates a phase comparator for comparing an edge of the regenerated data and a phase of a regenerated clock (CLK) and generating a pulse P or a pulse N according to a degree of a phase advance or a degree of a phase lag. 5 indicates a charge pump (C.P.) for charging a condenser 6 with electric current in response to the inputting of the pulse P to heighten an electric potential of the condenser 6 or discharging electric current from the condenser 6 in response to the inputting of the pulse N to lower an electric potential of the condenser 6. 7 indicates a voltage control oscillator (VCO) which oscillates at a frequency corresponding to the electric potential of the condenser 6 to produce the regenerated clock.

Next, an operation is described.

In an information regenerating apparatus in which data is regenerated from input data read out from an optical disk, it is required to produce a clock which synchronizes with the regenerated data. Therefore, a method, in which a clock is regenerated by controlling a voltage control oscillator according to a phase difference between an edge of the regenerated data and the clock, is generally used.

In FIG. 11, in the auto-gain controller 1, an amplitude of the input data read out from an optical disk is adjusted to a constant value. In the wave form equalizer 2, a wave form of the input data, of which the amplitude is adjusted, is reshaped by heightening a gain of an attenuated high-frequency signal component of the input data and removing an unnecessary high-frequency noise of the input data. In the slicer 3, the input data, of which the waveform is reshaped, is expressed in binary data of "0" and "1" according to a comparison between the input data and a reference electric potential, and regenerated data is produced.

Also, as to the regeneration of a clock, in the phase comparator 4, an edge of the regenerated data is compared with a phase of a regenerated clock produced in the voltage control oscillator 7, and a pulse P or a pulse N is generated according to a degree of a phase advance or a degree of a phase lag. In the charge pump 5, the condenser 6 is charged with electric current in response to the inputting of the pulse P to heighten an electric potential of the condenser 6, or electric current is discharged from the condenser 6 in response to the inputting of the pulse N to lower an electric potential of the condenser 6. The voltage control oscillator 7 oscillates at a frequency corresponding to the electric potential of the condenser 6 and produces the regenerated clock which is synchronized with the regenerated data.

FIG. 12 is a timing chart showing an operation of the conventional information regenerating apparatus.

As shown in FIG. 12, in cases where a leading edge of the regenerated data (DATA) is earlier than a leading edge of the regenerated clock (CLK), that is, in cases where a phase of the regenerated clock is late, a pulse P is generated to heighten an electric potential (C) of the condenser 6, and a frequency of the regenerated clock is heightened. In contrast, in cases where a leading edge of the regenerated data (DATA) is later than a leading edge of the regenerated clock (CLK), that is, in cases where a phase of the regenerated clock is advanced, a pulse N is generated to lower an electric potential (C) of the condenser 6, and a frequency of the regenerated clock is lowered.

Because the conventional information regenerating apparatus has the above-described configuration, all constituent elements of the conventional information regenerating apparatus are made of analog circuits. However, in cases where a plurality of conventional information regenerating apparatuses are, for example, made of complementary metal oxide semiconductor large scale integrated circuits (CMOS-LSI), because characteristics of p-channel transistors and characteristics of n-channel transistors lack uniformity, the electric currents in the charge pumps 5 of the conventional information regenerating apparatuses lack uniformity and are set to various values. Therefore, a phase lock point of a phase synchronization loop is shifted from a value corresponding to an ideal state, and a clock regeneration characteristic becomes worse. That is, because characteristics of circuit elements of analog circuits lack uniformity, there is a problem that characteristics of the conventional information regenerating apparatuses lack uniformity.

SUMMARY OF THE INVENTION

An object of the present invention is to provide, with due consideration to the drawbacks of the conventional information regenerating apparatus, an information regenerating apparatus which is made of digital circuits, is operated at a uniform characteristic and has a high performance. Also, the object of the present invention is to provide an information regenerating method applied for the information regenerating apparatus.

The object is achieved by the provision of an information regenerating apparatus comprising an analog-to-digital converter for converting input data into digital data by performing a data-extraction for the input data in synchronization with a regenerated clock, a zero-cross detector for detecting a zero-cross of the digital data converted in the analog-to-digital converter according to the two pieces of digital data one after another converted in the analog-to-digital converter, a phase detector for detecting a phase shift quantity between a mid point of two data extracting points of two pieces of digital data, which are data-extracted in the analog-to-digital converter before and after the detection of the zero-cross of the digital data performed in the zero-cross detector, and a zero-cross point of the two pieces of digital data in cases where the zero-cross of the digital data is detected in the zero-cross detector, a frequency calculating unit for calculating target oscillation frequency data by adding up the plurality of phase shift quantities detected in the phase detector, a digital-to-analog converter for converting the target oscillation frequency data calculated in the frequency calculating unit into analog data, and a voltage control oscillator for generating the regenerated clock according to the analog data converted in the digital-to-analog converter and providing the regenerated clock for the analog-to-digital converter.

Because the zero-cross detector, the phase detector and the frequency calculating unit arranged between the analog-to-digital converter and the digital-to-analog converter can be made of digital circuits, the information regenerating apparatus does not receive an adverse influence in which characteristics of analog circuits lack uniformity, and the information regenerating apparatus, which is operated at a uniform characteristic and has a high performance, can be obtained.

Also, the phase shift quantity between the mid point of the two data extracting points of the two pieces of digital data, which are data-extracted in the analog-to-digital converter before and after the detection of the zero-cross of the digital data, and the zero-cross point of the two pieces of digital data is detected in the phase detector. Therefore, even though amplitude values of the two pieces of digital data data-extracted in the analog-to-digital converter vary with time, a changing degree of the amplitude of one piece of digital data is equal to that of the other piece of digital data. Accordingly, the phase shift quantity does not receive the adverse influence of the change of the amplitudes of the two pieces of digital data, and the information regenerating apparatus having a high performance can be obtained.

It is preferred that the information regenerating apparatus further comprises a low pass filter for filtering the analog data converted in the digital-to-analog converter and outputting the filtered analog data to the voltage control oscillator.

Therefore, even though the analog data converted in the digital-to-analog converter is changed by stages, the rapid change of the oscillating frequency in the voltage control oscillator 7 can be prevented.

It is also preferred that the information regenerating apparatus further comprises a jitter calculating unit for calculating a jitter quantity of the regenerated clock for the input data according to an average of absolute values of the phase shift quantities detected in the phase detector.

Therefore, the information regenerating apparatus, in which the jitter quantity of the regenerated clock for the input data can be output, can be obtained.

It is also preferred that the information regenerating apparatus further comprises a defect mask circuit for masking the detection of the zero-cross of the digital data performed in the zero-cross detector according to a lack of the input data.

Therefore, an erroneous operation of the frequency calculating unit based on an erroneous detection of the zero-cross of the digital data can be prevented, and the synchronization of the regenerated clock with the input data can be reliably maintained.

The object is also achieved by the provision of an information regenerating method comprising the steps of converting input data into digital data by performing a data-extraction for the input data in synchronization with a regenerated clock, detecting a zero-cross of the digital data according to the two pieces of digital data one after another converted, detecting a phase shift quantity between a mid point of two data extracting points of two pieces of digital data, which are data-extracted before and after the detection of the zero-cross of the digital data, and a zero-cross point of the two pieces of digital data, calculating target oscillation frequency data by adding up the plurality of detected phase shift quantities, converting the calculated target oscillation frequency data into analog data, and generating the regenerated clock according to the converted analog data.

Therefore, the information regenerating method can be performed by using digital circuits, the information regenerating method does not receive an adverse influence that characteristics of analog circuits lack uniformity, and the information regenerating method applied for an information regenerating apparatus, which is operated at a uniform characteristic and has a high performance, can be obtained.

Also, the phase shift quantity between the mid point of the two data extracting points of the two pieces of digital data, which are data-extracted before and after the detection of the zero-cross of the digital data, and the zero-cross point of the two pieces of digital data is detected. Therefore, even though amplitude values of the two pieces of digital data data-extracted vary with time, a changing degree of the amplitude value of one piece of digital data is equal to that of the other piece of digital data. Accordingly, the phase shift quantity does not receive the adverse influence of the change of the amplitude values of the two pieces of digital data, and the information regenerating method applied for an information regenerating apparatus, which has a high performance, can be obtained.

DETAILED DESCRIPTION OF THE PREFERRED EMBODIMENTS

Embodiments of the present invention will now be described with reference to the accompanying drawings.

EMBODIMENT 1

Figure 1:
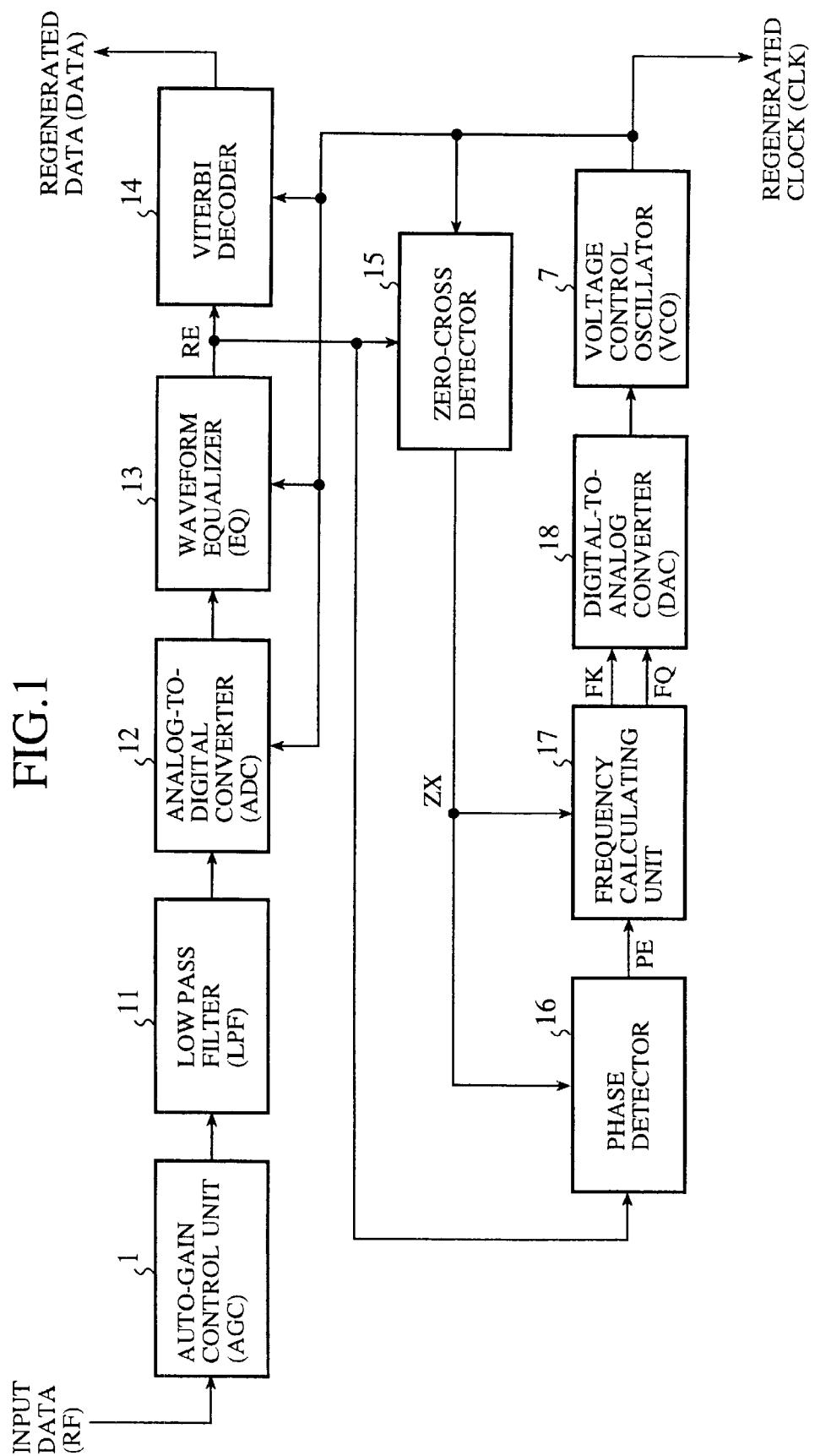
FIG. 1 is a constitutional diagram showing an information regenerating apparatus according to a first embodiment of the present invention.

FIG. 1 is a constitutional diagram showing an information regenerating apparatus according to a first embodiment of the present invention. In FIG. 1, 1 indicates an auto-gain controller (AGC) for adjusting an amplitude of input data (RF) read out from an optical disk. 11 indicates a low pass filter for filtering the input data to suppress a folding noise included in the input data. 12 indicates an analog-to-digital (A/D) converter (ADC) for data-extracting the input data in synchronization with a regenerated clock (CLK) and converting the input data into digital data. 13 indicates a waveform equalizer (EQ) for reshaping the digital data converted in the A/D converter 12. The waveform equalizer 13 has a digital filter for heightening a gain of an attenuated high-frequency signal component of the digital data. 14 indicates a Viterbi decoder for performing a maximum likelihood decoding for the digital data (RE), of which the waveform is reshaped, in synchronization with the regenerated clock (CLK) to produce binary regenerated data (DATA).

15 indicates a zero-cross detector for monitoring a sign bit (or a most significant bit: MSB) of the digital data (RE), of which the waveform is reshaped, and outputting a zero-cross detecting signal ZX indicating the zero-cross detection in cases where a change from one sign bit indicating a negative value (or a positive value) to another sign bit indicating a positive value (or a negative value) is detected. 16 indicates a phase detector for receiving two pieces of digital data RE, which are obtained by performing both the data-extraction of the A/D converter 12 and the waveform reshape of the waveform equalizer 13 before and after the zero-cross detection indicated by the zero-cross detecting signal ZX, in cases where the zero-cross detecting signal ZX is received and detecting a phase shift quantity PE between a mid point of two data extracting points of the two pieces of digital data RE and a zero-cross point of the two pieces of digital data RE. 17 indicates a frequency calculating unit for calculating a sum of phase shift quantities PE, outputting target oscillation frequency data FQ and outputting renewal timing data FK. 18 indicates a digital-to-analog (D/A) converter for converting the target oscillation frequency data FQ into analog data according to the renewal timing data FK output from the frequency calculating unit 17. 7 indicates a voltage control oscillator (VCO) for generating the regenerated clock (CLK) according to the analog data converted in the D/A converter 18 and providing the regenerated clock (CLK) for the A/D converted 12, the waveform equalizer 13, the Viterbi decoder 14 and the zero-cross detector 15.

Figure 2:
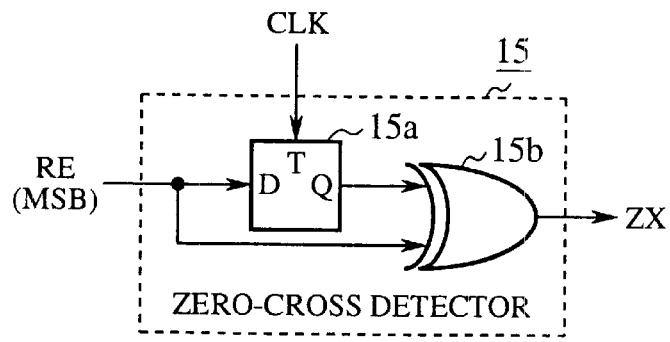
FIG. 2 is a constitutional diagram showing a zero-cross detector in detail according to the first embodiment of the present invention.

FIG. 2 is a constitutional diagram showing the zero-cross detector in detail according to the first embodiment of the present invention. In FIG. 2, 15a indicates a flip-flop circuit for receiving the sign bit (MSB) of the digital data RE at a D input terminal, receiving the regenerated clock (CLK) at a T input terminal and outputting the sign bit of the digital data RE, which is received before the reception of the regenerated clock (CLK), from a Q output terminal. 15b indicates an exclusive OR circuit for performing an exclusive OR operation for a sign bit of current digital data RE directly received from the waveform equalizer 13 and a sign bit of preceding digital data RE received from the flip-flop circuit 15a and outputting the zero-cross detecting signal ZX in cases where the change of the sign bit is detected.

Figure 3:
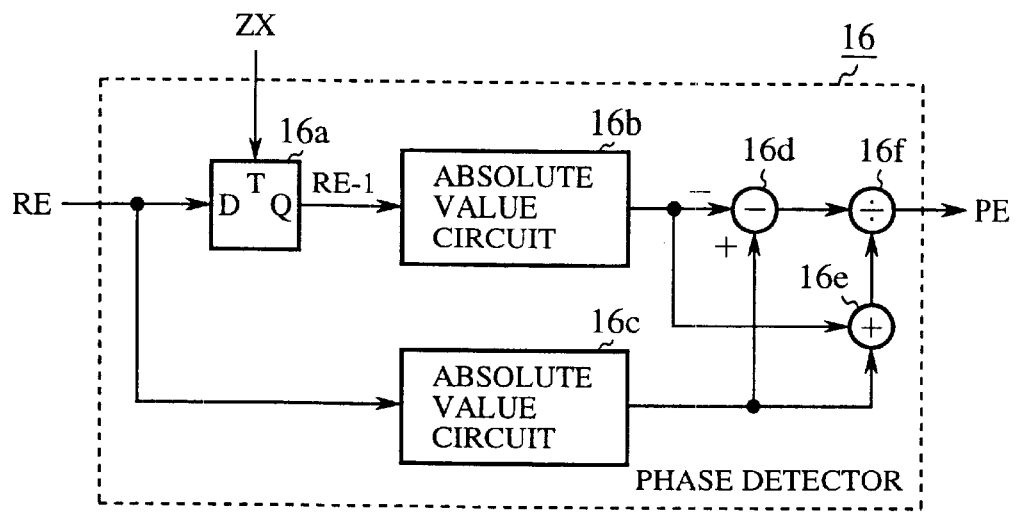
FIG. 3 is a constitutional diagram showing a phase detector in detail according to the first embodiment of the present invention.

FIG. 3 is a constitutional diagram showing the phase detector in detail according to the first embodiment of the present invention. In FIG. 3, 16a indicates a flip-flop circuit for receiving the digital data RE sent from the waveform equalizer 13 at a D input terminal in synchronization with the zero-cross detecting signal ZX received at a T input terminal and outputting digital data RE-1, which is received before the reception of the zero-cross detecting signal ZX, from a Q output terminal. 16b indicates an absolute value circuit for calculating an absolute value of the digital data RE-1, which is received from the flip-flop circuit 16a before the zero-cross detection indicated by the zero-cross detecting signal ZX. 16c indicates an absolute value circuit for calculating an absolute value of the digital data RE which is directly received from the waveform equalizer 13 after the zero-cross detection indicated by the zero-cross detecting signal ZX. 16d indicates a subtracting unit for subtracting the absolute value of the digital data RE-1 from the absolute value of the digital data RE. 16e indicates an adder for adding up the absolute value of the digital data RE-1 and the absolute value of the digital data RE. 16f indicates a divider for dividing a difference obtained in the subtracting unit 16d by a sum obtained in the adder 16e.

Figure 4:
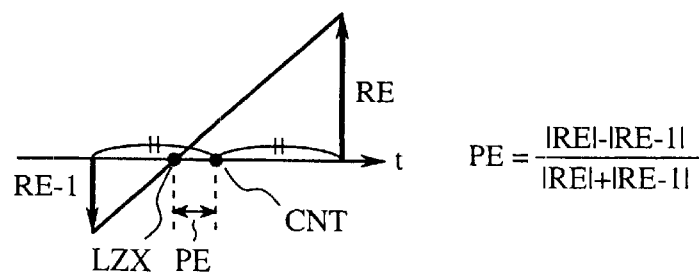
FIG. 4 is an explanatory view showing a function of a phase detector according to the first embodiment of the present invention.

FIG. 4 is an explanatory view showing a function of the phase detector according to the first embodiment of the present invention.

Figure 5:
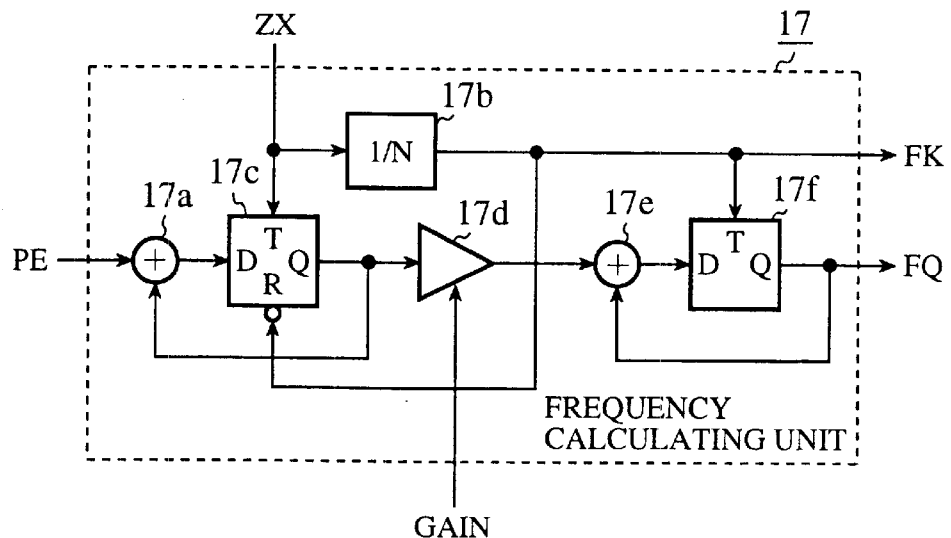
FIG. 5 is a constitutional diagram showing a frequency calculating unit in detail according to the first embodiment of the present invention.

FIG. 5 is a constitutional diagram showing the frequency calculating unit in detail according to the first embodiment of the present invention. In FIG. 5, 17a indicates an adder for adding up the phase shift quantity PE sent from the phase detector 16 and a phase shift quantity PE output from a Q output terminal of a flip-flop circuit 17c. 17b indicates a frequency demultiplier for demultiplying a frequency of the zero-cross detecting signal ZX to produce 1/N (N is an arbitrary natural number of the frequency) of the frequency and outputting a signal having 1/N of the frequency as the renewal timing data FK. 17c indicates the flip-flop circuit for receiving a summed phase shift quantity PE obtained in the adder 17a at a D input terminal, receiving the zero-cross detecting signal ZX at a T input terminal and outputting the summed phase shift quantity PE, which is received before the reception of the zero-cross detecting signal ZX, from the Q output terminal for each reception of the zero-cross detecting signal ZX. The flip-flop circuit 17c is reset by the renewal timing data FK received at an R input terminal. 17d indicates a digital multiplier for adjusting a gain of the summed phase shift quantity PE, which is obtained by adding up N phase shift quantities PE and is output from the flip-flop circuit 17c, to calculate an average of the N phase shift quantities PE. 17e indicates an adder for adding up an average phase shift quantity PE obtained in the digital multiplier 17d and the target oscillation frequency data FQ output from a Q output terminal of a flip-flop circuit 17f. 17f indicates the flip-flop circuit for receiving a summed value, which is obtained by adding up the average phase shift quantity PE and the target oscillation frequency data FQ, at a D input terminal, receiving the renewal timing data FK at a T input terminal and outputting the summed value, which is received before the reception of the renewal timing data FK, from a Q output terminal as the target oscillation frequency data FQ for each reception of the renewal timing data FK.

Next, an operation is described.

In FIG. 1, in the auto-gain controller 1, an amplitude of the input data (RF) read out from an optical disk is adjusted. In the low pass filter 11, the input data, of which the amplitude is adjusted, is filtered to suppress a folding noise existing in the input data. In the A/D converter 12, the data-extraction is performed for the input data, in which the folding noise is suppressed, in synchronization with the regenerated clock (CLK) to convert the input data into digital data. In the waveform equalizer 13, the waveform of the digital data converted in the A/D converter 12 is reshaped. In the Viterbi decoder 14, the maximum likelihood decoding is performed for the digital data RE, of which the waveform is reshaped, in synchronization with the regenerated clock (CLK) to produce binary regenerated data (DATA).

Also, as to the regeneration of a clock, in the zero-cross detector 15, a sign bit (MSB) of the digital data (RE), of which the waveform is reshaped, is monitored, and a zero-cross detecting signal ZX indicating the detection of a zero-cross of the digital data is output according to the change of the sign bit.

In FIG. 2 showing the zero-cross detector 15, in the flip-flop circuit 15a, the sign bit (MSB) of the digital data RE is received at the D input terminal, and the sign bit of the digital data RE, which is received before the reception of the regenerated clock (CLK) from the T input terminal, is output from the Q output terminal. In the exclusive OR circuit 15b, an exclusive OR operation is performed for a sign bit of current digital data RE directly received from the waveform equalizer 13 and a sign bit of preceding digital data RE received from the flip-flop circuit 15a, and the zero-cross detecting signal ZX is output in cases where the change of the sign bit is detected.

In the phase detector 16, two pieces of digital data RE, which are obtained by performing both the data-extraction of the A/D converter 12 and the waveform reshape of the waveform equalizer 13 before and after the zero-cross detection indicated by the zero-cross detecting signal ZX, are received from the waveform equalizer 13 in cases where the zero-cross detecting signal ZX is received from the zero-cross detector 15, a phase shift quantity PE between a mid point of two data extracting points of the two pieces of digital data RE and a zero-cross point of the two pieces of digital data RE is detected.

In FIG. 3 showing the phase detector 16, the digital data RE sent from the waveform equalizer 13 is received at the D input terminal of the flip-flop circuit 16a and the absolute value circuit 16c in synchronization with the zero-cross detecting signal ZX of the zero-cross detector 15 which is received at the T terminal of the flip-flop circuit 16a, and digital data RE−1, which is received before the reception of the zero-cross detecting signal ZX, is output from the Q output terminal of the flip-flop circuit 16a. In the absolute value circuit 16b, an absolute value of the digital data RE−1 received before the zero-cross detection indicated by the zero-cross detecting signal ZX is calculated. In the absolute value circuit 16c, an absolute value of the digital data RE received after the zero-cross detection indicated by the zero-cross detecting signal ZX is calculated. In the subtracting unit 16d, the absolute value of the digital data RE−1 is subtracted from the absolute value of the digital data RE to obtain a difference. In the adder 16e, the absolute value of the digital data RE−1 and the absolute value of the digital data RE are added up to obtain a sum. In the divider 16f, the difference is divided by the sum, and an obtained value is output as a phase shift quantity PE.

A function of the phase detector 16 shown in FIG. 3 is shown in FIG. 4. As shown in FIG. 4, In cases where the zero-cross detecting signal ZX sent from the zero-cross detector 15 is received in the phase detector 16, the digital data RE−1 and the digital data RE, which are obtained by performing both the data-extraction of the A/D converter 12 and the waveform reshape of the waveform equalizer 13 before and after the zero-cross detection indicated by a zero-cross detecting signal ZX, is received from the waveform equalizer 13, and a phase shift quantity PE between a mid point CNT of two data extracting points of the two pieces of digital data RE−1 and RE and a logical zero-cross point LZX of the two pieces of digital data RE−1 and RE is detected. To detect the phase shift quantity PE, a linear calculation shown in FIG. 4 is performed. Here, the mid point CNT of the two data extracting points is an ideal value of a phase of the regenerated clock to be generated according to the input data, the logical zero-cross point LZX is placed at a crossing point between a zero-line and a partial line which connects an amplitude value of the digital data RE−1 and an amplitude value of the digital data RE, and the phase shift quantity PE indicates a difference of a phase of the current regenerated clock from a phase of an ideal regenerated clock.

In the phase detector 16, to satisfy the function shown in FIG. 4, the calculation;

$$PE = (|RE| - |RE-1|)/(|RE| + |RE-1|)$$

is performed by using the configuration shown in FIG. 3.

In the frequency calculating unit 17, a sum of phase shift quantities PE is calculated, and target oscillation frequency data FQ is output. Also, renewal timing data FK is output.

In FIG. 5 showing the frequency calculating unit 17, in the frequency demultiplier 17b, a frequency of the zero-cross detecting signal ZX is demultiplied to produce 1/N of the frequency, and a signal having 1/N of the frequency is output as the renewal timing data FK. In the flip-flop circuit 17c, a phase shift quantity PE is received at the D input terminal, the zero-cross detecting signal ZX is received at the T input terminal, and the phase shift quantity PE, which is received before the reception of the zero-cross detecting signal ZX, is output from the Q output terminal for each reception of the zero-cross detecting signal ZX. In the adder 17a, a current phase shift quantity PE output from the phase detector 16 and the phase shift quantity PE, which is output from the adder 17a at a preceding time and is returned from the Q output terminal of the flip-flop circuit 17c, are adding up at a current time to produce a summed phase shift quantity PE, and the summed phase shift quantity PE is output to the D input terminal of the flip-flop circuit 17c. Therefore, because the flip-flop circuit 17c is reset by the renewal timing data FK input from the R input terminal, a summed phase shift quantity PE, which denotes the sum of N phase shift quantities PE corresponding to N zero-cross detecting signals ZX received in the flip-flop circuit 17c, is output from the Q output terminal of the flip-flop circuit 17c to the digital multiplier 17d. In the digital multiplier 17d, a gain of the summed phase shift quantity PE, which denotes the sum of the N phase shift quantities PE and is output from the flip-flop circuit 17c, is adjusted to calculate an average of the N phase shift quantities PE. In the adder 17e, the average phase shift quantity PE and the target oscillation frequency data FQ output from the Q output terminal of the flip-flop circuit 17f are added up. In the flip-flop circuit 17f, a summed value, which is obtained by adding up the average phase shift quantity PE and the target oscillation frequency data FQ, is received at the D input terminal, the renewal timing data FK is received at the T input terminal, and the summed value, which is received before the reception of the renewal timing data FK, is output from the Q output terminal as the target oscillation frequency data FQ for each reception of the renewal timing data FK.

Here, a reason that the target oscillation frequency data FQ is output from the frequency calculating unit 17 according to the renewal timing data FK, of which the frequency is 1/N of that of the zero-cross detecting signal ZX, is as follows. A high frequency is not required for a loop back response performance in the oscillation frequency control (frequency control at several kHz is sufficient for a signal rate of several tens MHz). Therefore, a loop back system can be stabilized by averaging a plurality of added phase errors according to 1/N of the frequency of the zero-cross detecting signal ZX, and the D/A converter 18 appropriate to a low frequency can be used.

In the D/A converter 18, the target oscillation frequency data FQ is converted into analog data according to the renewal timing data FK output from the frequency calculating unit 17. In the voltage control oscillator 7, the regenerated clock (CLK) is generated according to the analog data converted in the D/A converter 18, and the regenerated clock (CLK) is provided for the A/D converted 12, the waveform equalizer 13, the Viterbi decoder 14 and the zero-cross detector 15.

Accordingly, the phase of the regenerated clock output from the voltage control oscillator 7 is adjusted to the mid point CNT of the two data extracting points shown in FIG. 4, so that the regenerated clock, of which the phase is adjusted according to the input data, can be output.

Here, the linearity between the analog data output from the D/A converter 18 and an oscillating frequency of a clock generated in the voltage control oscillator 7 is important. For example, a ring oscillator, in which an odd-number of inverters are connected with each other in ring shape in a CMOS-LSI, has a superior linearity characteristic.

As is described above, in the first embodiment, because the waveform equalizer 13, the Viterbi decoder 14, the zero-cross detector 15, the phase detector 16 and the frequency calculating unit 17 arranged between the A/D converter 12 and the D/A converter 18 can be made of digital circuits, the information regenerating apparatus does not receive an adverse influence in which characteristics of analog circuits lack uniformity, and the information regenerating apparatus, which is operated at a uniform characteristic and has a high performance, can be obtained.

Also, the target oscillation frequency data FQ is converted into the analog data in the D/A converter 18, and the analog data is directly supplied to the voltage control oscillator 7. Therefore, the information regenerating apparatus does not receive an adverse influence in which a characteristic of an assumed analog circuit placed between the D/A converter 18 and the voltage control oscillator 7 lack uniformity, and the information regenerating apparatus, which is operated at a uniform characteristic and has a high performance, can be obtained.

Also, the phase shift quantity PE between the mid point CNT of the two data extracting points of the two pieces of digital data RE−1 and RE, which are data-extracted in the A/D converter 12 before and after the zero-cross detection, and the logical zero-cross point LZX of the two pieces of digital data RE−1 and RE is detected in the phase detector 16, and the regenerated clock, of which the phase is adjusted so as to decrease the phase shift quantity PE to zero, is generated in the voltage control oscillator 7. In this case, even though amplitudes of the two pieces of digital data RE−1 and RE data-extracted in the A/D converter 12 vary with time, a changing degree of the digital data RE−1 is equal to that of the digital data RE. Therefore, the logical zero-cross point LZX, which is placed at the crossing point between the zero-line and the partial line connecting the amplitude value of the digital data RE−1 and the amplitude value of the digital data RE, does not receive an adverse influence of the change of the amplitudes of the two pieces of digital data RE−1 and RE. Accordingly, the phase shift quantity PE does not receive the adverse influence of the change of the amplitudes of the two pieces of digital data RE−1 and RE, and the information regenerating apparatus having a high performance can be obtained.

In addition, because the decoding is performed in the Viterbi decoder 14 according to the two pieces of digital data RE positioned in ideal sampling positions which are placed in front and in the rear of the logical zero-cross point LZX at equal distances, the information regenerating apparatus having a high decoding performance can be obtained.

EMBODIMENT 2

Figure 6:
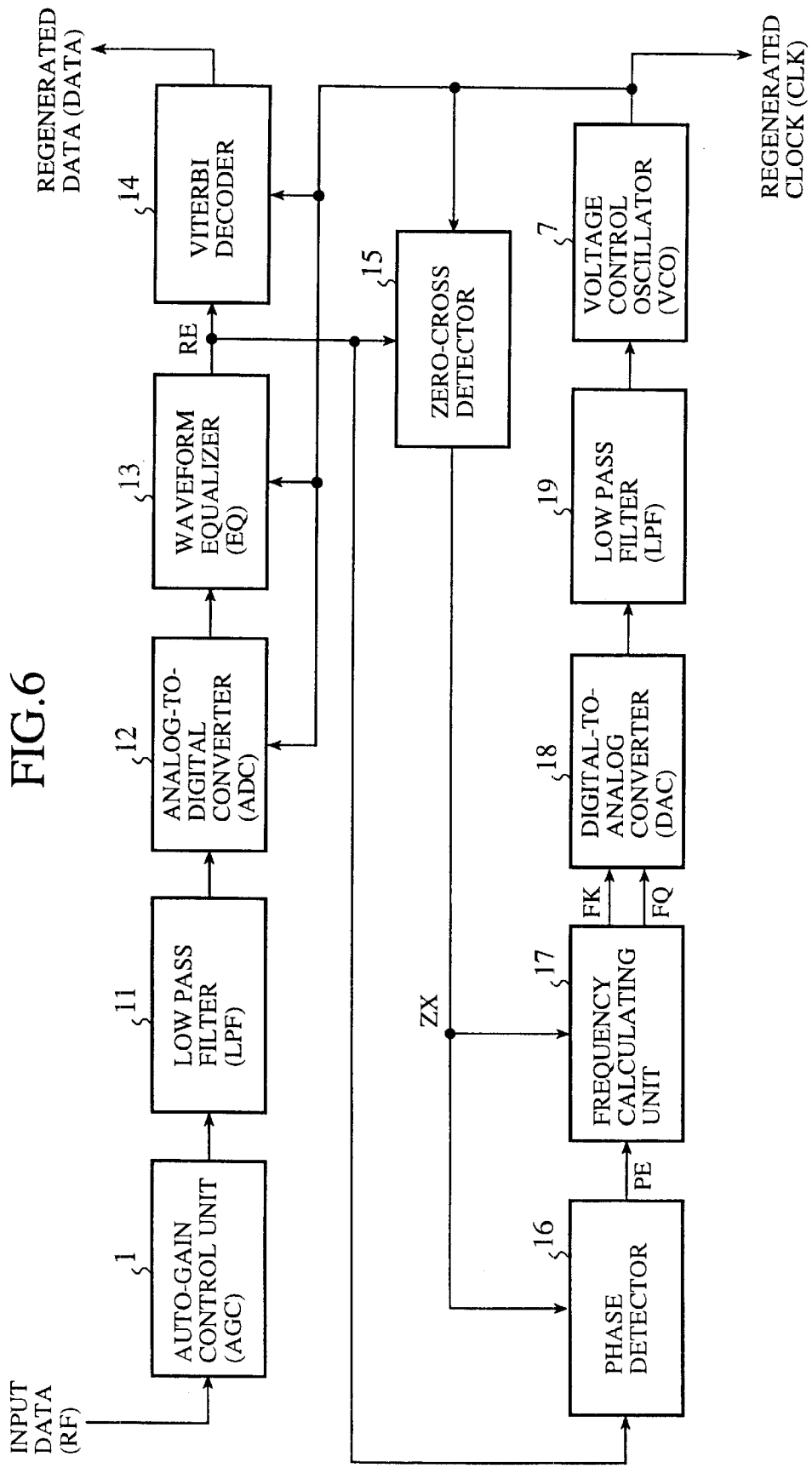
FIG. 6 is a constitutional diagram showing an information regenerating apparatus according to a second embodiment of the present invention.

FIG. 6 is a constitutional diagram showing an information regenerating apparatus according to a second embodiment of the present invention. In FIG. 6, 19 indicates a low pass filter (LPF) for filtering the analog data converted in the D/A converter 18 and outputting the filtered analog data to the voltage control oscillator 7. Because the other constituent elements are the same as those shown in FIG. 1, the duplicated description of the other constituent elements is omitted.

Figure 7:
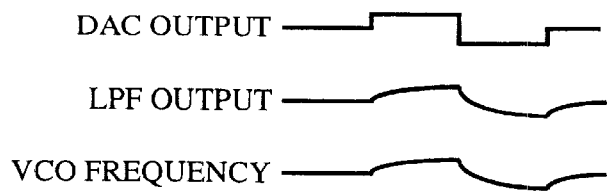
FIG. 7 is a waveform view showing a function of a low pass filter according to the second embodiment of the present invention.

FIG. 7 is a waveform view showing a function of the low pass filter 19 according to the second embodiment of the present invention.

Figure 8:
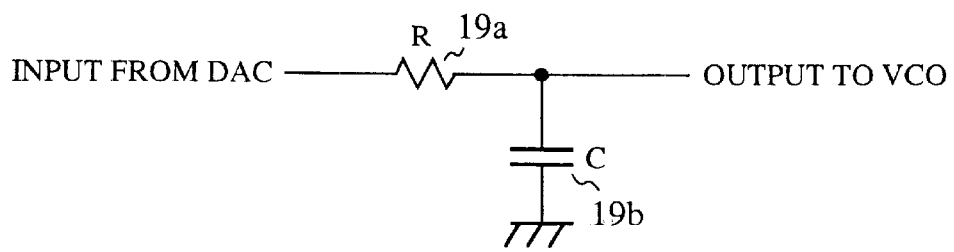
FIG. 8 is a constitutional diagram showing the low pass filter in detail according to the second embodiment of the present invention.

FIG. 8 is a constitutional diagram showing the low pass filter 19 in detail according to the second embodiment of the present invention. In FIG. 8, 19a indicates a resistor (R), and 19b indicates a condenser (C).

Next, an operation is described.

In the configuration of the information regenerating apparatus according to the first embodiment, the analog data converted in the D/A converter 18 is directly output to the voltage control oscillator 7. Therefore, in cases where the phase shift quantity PE is large and in cases where the analog data converted in the D/A converter 18 changes with time by stages, there is a possibility that the oscillating frequency of the voltage control oscillator 7 rapidly changes so as to make a loop back system unstable.

Therefore, as shown in FIG. 6, the low pass filter 19 is arranged between the D/A converter 18 and the voltage control oscillator 7, and it is prevented that the oscillating frequency in the voltage control oscillator 7 rapidly changes.

An operation of the low pass filter 19 is shown in FIG. 7. The analog data, which is converted in the D/A converter 18 and changes by stages, is made smooth in the low pass filter 19. Therefore, the change of the oscillating frequency in the voltage control oscillator 7 can be made smooth, and the loop back system can be stably controlled.

As shown in FIG. 8, the low pass filter 19, which has a simple configuration of both the resistor 19a and the condenser 19b, is useful.

As is described above, in the second embodiment, the analog data converted in the D/A converter 18 is filtered in the low pass filter 19, and the filtered analog data is output to the voltage control oscillator 7. Accordingly, even though the analog data converted in the D/A converter 18 changes with time by stages, the rapid change of the oscillating frequency in the voltage control oscillator 7 can be prevented.

EMBODIMENT 3

Figure 9:
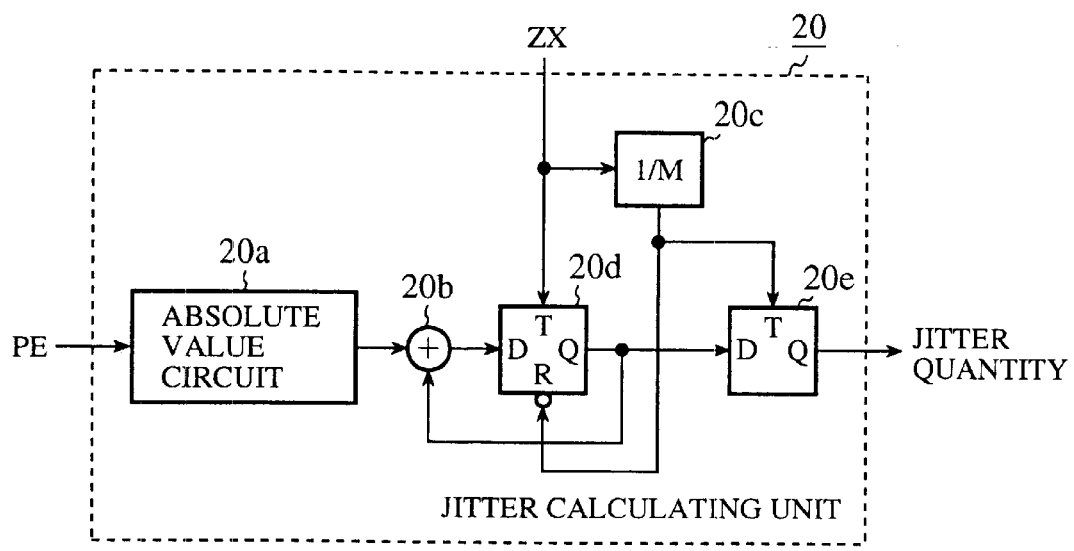
FIG. 9 is a constitutional diagram showing a jitter calculating unit in detail according to a third embodiment of the present invention.

FIG. 9 is a constitutional diagram showing a jitter calculating unit in detail according to a third embodiment of the present invention. In FIG. 9, 20 indicates a jitter calculating unit for calculating a jitter quantity (or a phase change quantity) of the regenerated clock for the input data according to a sum (or an average) of absolute values of a plurality of phase shift quantities PE detected in the phase detector 16 and outputting the jitter quantity to the waveform equalizer 13 and/or the frequency calculating unit 17.

20a indicates an absolute value circuit for calculating an absolute value of the phase shift quantity PE. 20b indicates an adder for adding up the absolute value of the phase shift quantity PE calculated in the absolute value circuit 20a and an absolute value of a phase shift quantity PE output from a Q output terminal of a flip-flop circuit 20d to produce an absolute value of a summed phase shift quantity PE. 20c indicates a frequency demultiplier for demultiplying a frequency of the zero-cross detecting signal ZX to produce a zero-cross detecting signal ZX having 1/M (M is an arbitrary natural number) of the frequency. 20d indicates a flip-flop circuit for receiving the absolute value of the summed phase shift quantity PE at a D input terminal, receiving the zero-cross detecting signal ZX at a T input terminal, and outputting the absolute value of the summed phase shift quantity PE, which is received before the reception of the zero-cross detecting signal ZX, from a Q output terminal for each reception of the zero-cross detecting signal ZX. The flip-flop circuit 20d is reset according to the-zero-cross detecting signal ZX having 1/M of the frequency which is received at an R input terminal. 20e indicates a flip-flop circuit for receiving the absolute value of the summed phase shift quantity PE output from the flip-flop 20d at a D input terminal, receiving the zero-cross detecting signal ZX having 1/M of the frequency at a T input terminal, and outputting the absolute value of the summed phase shift quantity PE, which is received before the reception of the zero-cross detecting signal ZX having 1/M of the frequency, from a Q output terminal as a jitter quantity of the regenerated clock fro each reception of the zero-cross detecting signal ZX having 1/M of the frequency.

Next, an operation is described.

In the jitter calculating unit 20 shown in FIG. 9, the frequency of the zero-cross detecting signal ZX is demultiplexed in the frequency demultiplier 20c to produce the zero-cross detecting signal ZX having 1/M of the frequency. In the flip-flop 20d, an absolute value of a phase shift quantity PE calculated in the absolute value circuit 20a is received at the D input terminal, the zero-cross detecting signal ZX is received at the T input terminal, and the absolute value of the phase shift quantity PE, which is received before the reception of the zero-cross detecting signal ZX, is output from the Q output terminal for each reception of the zero-cross detecting signal ZX. In the adder 20b, an absolute value of a current phase shift quantity PE calculated in the absolute value circuit 20a and the absolute value of the phase shift quantity PE, which is output at a preceding time from the Q output terminal of the flip-flop circuit 20d, are added up at a current time to produce an absolute value of a summed phase shift quantity PE, and the absolute value of the summed phase shift quantity PE is output to the D input terminal of the flip-flop 20d. Therefore, because the flip-flop circuit 20d is reset according to the zero-cross detecting signal ZX having 1/M of the frequency which is received at an R input terminal, the absolute value of the summed phase shift quantity PE, which denotes the sum of M phase shift quantities PE added up according to M zero-cross detecting signals ZX, are output from the flip-flop 20d. In the flip-flop 20e, the absolute value of the summed phase shift quantity PE is received at the D input terminal, the zero-cross detecting signal ZX having 1/M of the frequency is received at the T input terminal, and the absolute value of the summed phase shift quantity PE, which is received before the reception of the zero-cross detecting signal ZX having 1/M of the frequency, is output from the Q output terminal as a jitter quantity of the regenerated clock for each reception of the zero-cross detecting signal ZX having 1/M of the frequency.

Therefore, because the phase shift quantity PE detected in the phase detector 16 causes an instantaneous shift of the regenerated clock for the input data, the jitter quantity can be obtained according to a sum of the absolute values of the phase shift quantities PE. That is, the jitter quantity obtained in the jitter calculating unit 20 is monitored in the frequency calculating unit 17 and/or the waveform equalizer 13, and a system operation parameter such as a gain of the frequency calculating unit 17, a frequency demultiplying ratio N or a boost gain of the waveform equalizer 13 is adjusted to decrease the jitter quantity to a minimum value. Therefore, the information regenerating apparatus can be adaptively optimized.

In this embodiment, the jitter quantity is obtained according to a sum of the absolute values of the phase shift quantities PE. However, it is applicable that the jitter quantity be obtained according to an average of the absolute values of the phase shift quantities PE.

As is described above, because the jitter calculating unit 20, in which the jitter quantity of the regenerated clock for the input data is calculated according to a sum (or an average) of the absolute values of the phase shift quantities PE detected in the phase detector 16, is arranged in the information regenerating apparatus, the jitter quantity of the regenerated clock for the input data can be obtained, and the information regenerating apparatus can be adaptively optimized.

EMBODIMENT 4

Figure 10:
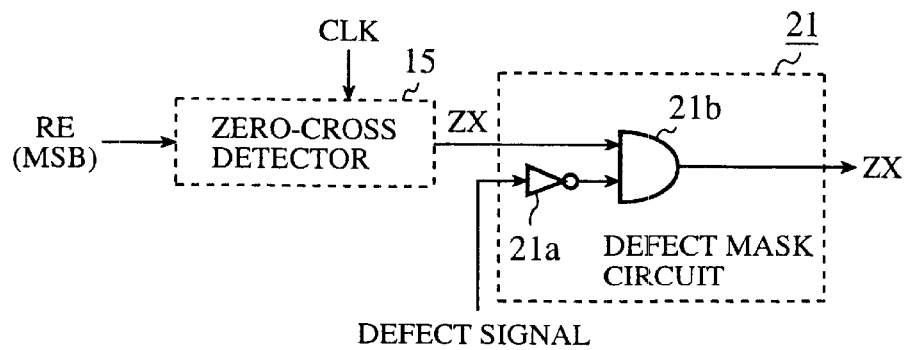
FIG. 10 is a constitutional diagram showing a defect mask circuit in detail according to a fourth embodiment of the present invention.
Figure 12:
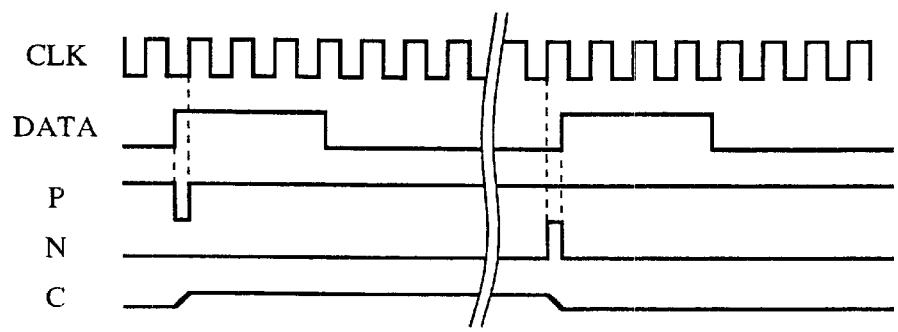
FIG. 12 a timing chart showing an operation of the prior art information regenerating apparatus.
Figure 11:
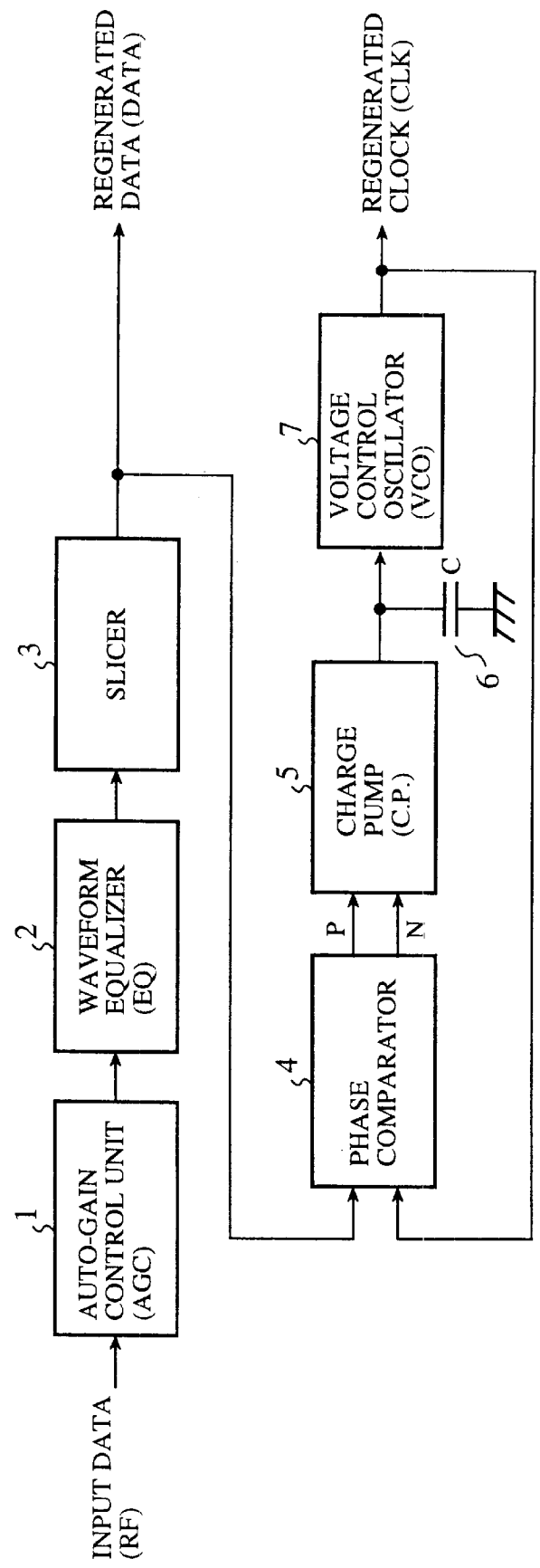
FIG. 11 is a constitutional diagram showing a prior art information regenerating apparatus.

FIG. 10 is a constitutional diagram showing a defect mask circuit in detail according to a fourth embodiment of the present invention. In FIG. 10, 21 indicates a defect mask circuit for masking the zero-cross detecting signal ZX output from the zero-cross detector 15 in response to a lack of the input data. 21a indicates an inverter circuit for inverting a defect signal. 21b indicates a logical multiply (AND) circuit for performing a logical multiply for the zero-cross detecting signal ZX and a defect signal inverted in the inverter circuit 21a.

Next, an operation is described.

In the defect mask circuit 21 shown in FIG. 10, a lack of the input data is detected by detecting a considerable reduction of an amplitude of the input data, and a defect signal indicating the lack of the input data is received. In the inverter circuit 21a, the defect signal is inverted. In the logical multiply circuit 21b, a logical multiply is performed for the zero-cross detecting signal ZX and the defect signal inverted in the inverter circuit 21a. Therefore, in cases where the defect signal indicating the lack of the input data is received, the zero-cross detecting signal ZX is not output from the logical multiply circuit 21b. That is, the zero-cross detecting signal ZX is masked, and the zero-cross detecting signal ZX is not received in each of the phase detector 16 and the frequency calculating unit 17.

For example, in cases where a scratch exists in a disk, when data is read out from the disk while passing through a portion of the scratch, the defect signal of a high level is sent to the defect mask circuit 21, and the zero-cross detecting signal ZX output from the zero-cross detector 15 is masked. Therefore, the frequency calculating unit 17 is set to a hold state, and the phase shift quantity PE received at a preceding time is maintained to be used as a phase shift quantity PE at a current time. Accordingly, an erroneous operation of the frequency calculating unit 17 based on an erroneous zero-cross detecting signal ZX can be prevented, and the synchronization of the regenerated clock with the input data can be reliably maintained.

As is described above, in the fourth embodiment, because the defect mask circuit 21, in which the zero-cross detecting signal ZX output from the zero-cross detector 15 is masked in response to the lack of the input data, is arranged in the information regenerating apparatus, an erroneous operation of the frequency calculating unit 17 based on an erroneous zero-cross detecting signal ZX can be prevented, and the synchronization of the regenerated clock with the input data can be reliably maintained.

What is claimed is:

1. An information regenerating apparatus comprising:
    an analog-to-digital converter for convening input data into digital data by performing a data-extraction for the input data in synchronization wit a regenerated clock;
    a zero-cross detector for detecting a zero-cross of the digital data convened in the analog-to-digital converter according to two pieces of digital data one alter another converted in the analog-to-digital converter;
    a defect mask circuit for masking the detection of the zero-cross of the digital data performed in the zero-cross detector according to a lack of the input data;
    a phase detector for detecting a phase shift quantity between a mid point of two data extracting points of the two pieces of digital data, which are data-extracted in the analog-to-digital converter before and after the detection of the zero-cross of the digital data performed in the zero-cross detector, and a zero-cross point of the two pieces of digital data when the zero-cross of the digital data is detected in the zero-cross detector;
    a frequency calculating unit for calculating oscillation frequency data by adding up a plurality of phase shift quantities detected in the phase detector;
    a digital-to-analog converter for converting the oscillation frequency data calculated in the frequency calculating unit into analog data; and
    a voltage control oscillator for generating the regenerated clock according to the analog data convened in the digital-to-analog converter and providing the regenerated clock for the analog-to-digital converter.

2. An information regenerating apparatus according to claim 1, further comprising:
    a low pass filter for filtering the analog data converted in the digital-to-analog converter and outputting the filtered analog data to the voltage control oscillator.

3. An information regenerating apparatus according to claim 1, further comprising:
    a jitter calculating unit for calculating a jitter quantity of the regenerated clock for the input data according to an average of absolute values of the phase shift quantities detected in the phase detector.

4. An information regenerating method comprising the steps of:
    converting input data into digital data by performing a data-extraction for the input data in synchronization with a regenerated clock;
    detecting a zero-cross of the digital data according to two pieces of digital data one after another;
    masking the detection of the zero-cross of the digital data performed in the zero-cross detector according to a lack of the input data;
    detecting a phase shift quantity between a mid point of two data extracting points of the two pieces of digital data, which are data-extracted before and after detection of the zero-cross of the digital data, and a zero-cross point of the two pieces of digital data;
    calculating oscillation frequency data by adding up a plurality of detected phase shift quantities;
    converting the calculated oscillation frequency data into analog data; and
    generating the regenerated clock according to the analog data.

* * * * *